(12) United States Patent
Higuchi

(10) Patent No.: US 7,576,603 B2
(45) Date of Patent: Aug. 18, 2009

(54) ARRANGEMENT FOR CANCELING OFFSET OF AN OPERATIONAL AMPLIFIER

(75) Inventor: Koji Higuchi, Ibaraki (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 12/052,201

(22) Filed: Mar. 20, 2008

(65) Prior Publication Data
US 2008/0238539 A1 Oct. 2, 2008

(30) Foreign Application Priority Data
Apr. 2, 2007 (JP) ............... 2007-096295

(51) Int. Cl.
*H03F 1/02* (2006.01)
(52) U.S. Cl. .......................... 330/9; 330/260
(58) Field of Classification Search .................. 330/9, 330/260; 327/124, 307
See application file for complete search history.

(56) References Cited

U.S. PATENT DOCUMENTS 5,610,838 A * 3/1997 Tokioka et al. ............... 702/56
5,748,035 A * 5/1998 Neugebauer ................ 327/562
6,445,444 B2 * 9/2002 Dunne ....................... 356/5.08
6,448,836 B2 9/2002 Kokubun et al.

* cited by examiner

*Primary Examiner*—Henry K Choe
(74) *Attorney, Agent, or Firm*—Studebaker & Brackett PC; Donald R. Studebaker

(57) ABSTRACT

Operational amplifier circuitry drives a device which may be run with a combination of output signals fewer in number than the output signals delivered from plural output circuits. Each output circuit adjusts the gain of an input signal supplied to its operational amplifier. An output selector selects and outputs output signals from the output circuits necessary for driving the device. A decision circuit compares an output signal not selected with a reference signal to adjust the gain of the output circuits to thereby cancel the offset of the operational amplifier. The operational amplifier has sets of feedback elements different in number between the sets formed by capacitances. Switching is made from one set to another until the decision circuit makes an acceptable decision. Offset may thus be canceled during the operational amplification even in case capacitive or resistance element is connected in circuit outside the operational amplifier.

9 Claims, 7 Drawing Sheets

Fig.6

| FIG. 5A | FIG. 5B |

ARRANGEMENT FOR CANCELING OFFSET OF AN OPERATIONAL AMPLIFIER

BACKGROUND OF THE INVENTION

1. Field of the Invention

The present invention relates to an operational amplifier, and more particularly to an arrangement for canceling offset of an operational amplifier having a feedback loop for gain adjustment.

2. Description of the Background Art

In order to suppress the offset involved in an operational amplifier, the conventional practice has been directed to increasing the area of the gate electrode of transistors constituting the operational amplifier so as to render the effect on its offset of variation in manufacturing process smaller.

As a solution of canceling the offset of an operational amplifier without increasing the gate area of transistors constituting the operational amplifier, an offset canceller has been proposed in, for example, U.S. Pat. No. 6,448,836 to Kokubun et al. The offset canceller is designed to cancel the offset in an amplifier to develop an output signal corresponding to an input signal.

In more detail, when a voltage is applied to the input terminal of an operational amplifier, the switching elements are changed over to cause a voltage involving offset to be stored in the capacitive element. The switching elements are then changed over to cause feedback such that the gate voltages of the operational amplifier will be of the same value, based on the voltage stored in the capacitive element, thereby canceling the offset of the operational amplifier.

However, in an operational amplifier circuit having its feedback elements, such as capacitive or resistive elements, for setting the amplification factor of the operational amplifier provided outside of the operational amplifier, it is necessary to correct the amplification factor in order to overcome the offset ascribable to the capacitance and resistance values. With the conventional offset canceller, however, it is difficult to deal with such a situation with ease.

Additionally, with the conventional offset canceller, it is not possible to output a signal during the offset canceling operation. Stated differently, the canceling operation needs to be carried out only after setting the offset cancel mode, thus affecting the operation efficiency.

SUMMARY OF THE INVENTION

It is an object of the present invention to provide operational amplifier circuitry which can cancel offset with ease, even in case a feedback element, such as capacitive and resistive elements, is connected in circuit outside of an operational amplifier per se, and simultaneously with producing an output signal.

Operational amplifier circuitry according to the present invention includes a plurality of output circuits each including an amplifier having an output port connected through a feedback circuit forming a feedback loop to an input port of the amplifier, each of the plurality of output circuits receiving an input signal and producing an output signal adjusted with a gain of the feedback circuit, a selector interconnected to the plurality of output circuits for selecting at least one of the output signals to output the selected output signal, and a comparator for comparing a reference signal with the output signal not selected. The feedback circuit comprises a plurality of feedback elements arranged to be selectable and weighted. The selector is responsive to the comparator to selectively connect the feedback elements to the feedback loop, whereby offset of the amplifier is canceled.

Further according to the present invention, operational amplifier circuitry comprises a plurality of output circuits each including an amplifier having an output port connected through a feedback circuit forming a feedback loop to an input port of the amplifier, each of the plurality of output circuits receiving an input signal and producing an output signal adjusted with a gain of the feedback circuit, a device driven by a combination of output signals fewer in number than the output signals produced by the plurality of output circuits, a selector interconnected to the plurality of output circuits for selecting at least one of the output signals output from the output circuits required for driving the device to output the selected output signal, a comparator for comparing a reference signal with the output signal not selected, and an offset canceller operative in response to the comparator for adjusting the gain of the plurality of output circuits to thereby cancel offset of the amplifier. The feedback circuit comprises a plurality of feedback elements. The feedback elements are connected to form a plurality of groups, each of which has at least one of the feedback elements provided different in number between the groups. The offset canceller comprises a switching circuit for switching each of the plurality of groups so as to join the feedback loop, and a control circuit for controlling the switching circuit to change a combination of the plurality of groups until the comparator determines a result of comparison acceptable.

With the present invention, described above, offset can readily be canceled even in case a feedback element, such as capacitive or resistance element, is connected in circuit outside the amplifier per se. In addition, the offset canceling operation may be carried out simultaneously with the usual operational amplification.

BRIEF DESCRIPTION OF THE DRAWINGS

The objects and features of the present invention will become more apparent from consideration of the following detailed description taken in conjunction with the accompanying drawings in which:

FIG. 6 shows how FIGS. 5A and 5B are arrayed relative to each other.

DESCRIPTION OF THE PREFERRED EMBODIMENTS

Figure 1:
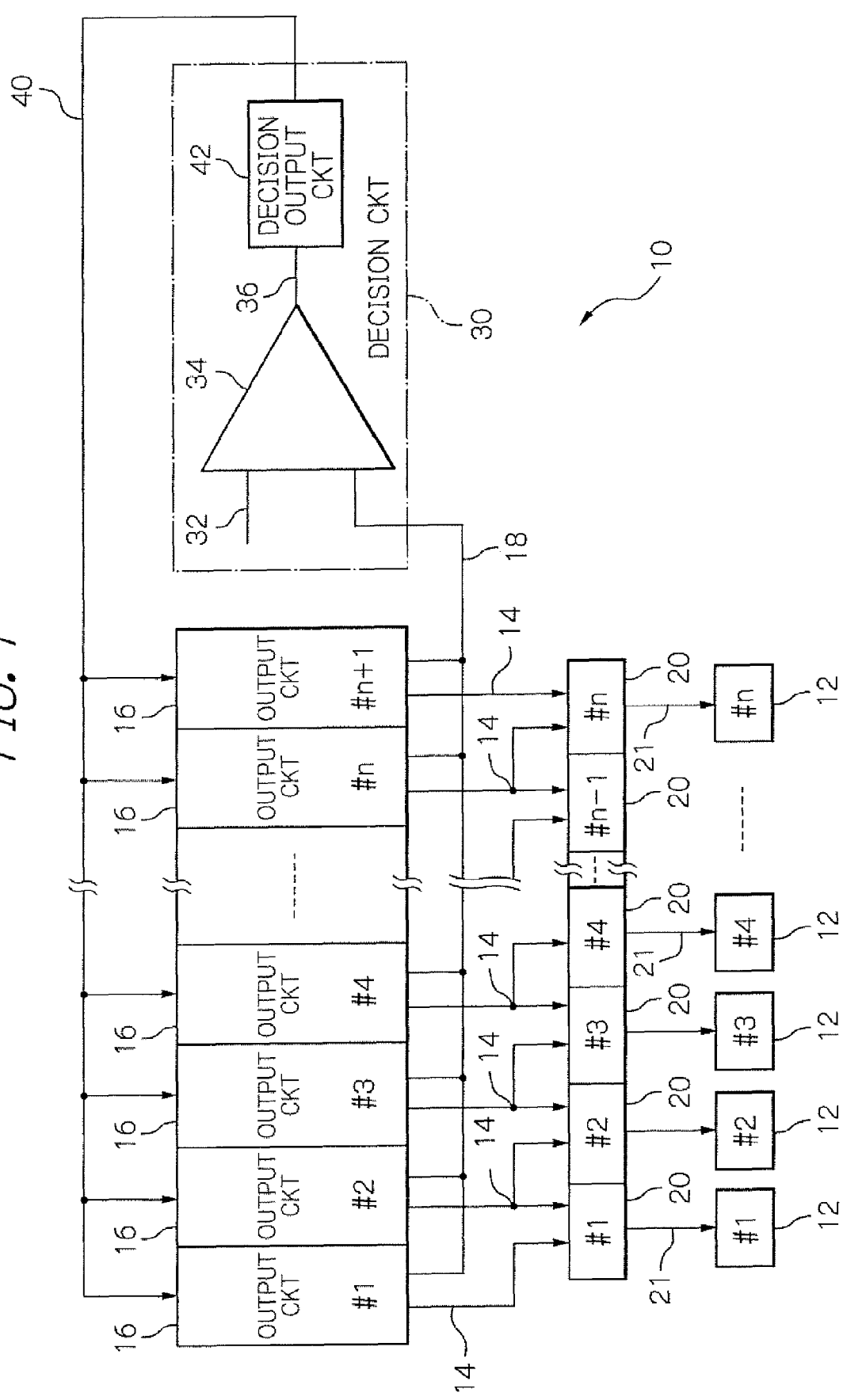
FIG. 1 is a schematic block diagram showing an overall schematic constitution of an illustrative embodiment of a liquid crystal display driver for driving an LCD device according to the present invention.

With reference first to FIG. 1, an illustrative embodiment of a liquid crystal display (LCD) driver 10 for driving an LCD display device, not shown, will be described, to which applied is the present invention, as an example. The LCD driver 10 includes a plurality (n+1) of output circuits 16 each serving as driving a liquid crystal display cell, and including an operational amplifier 210, FIG. 2, where n is a natural number. In the illustrative embodiment, the driver 10 is adapted for driving a corresponding plurality (n) of liquid crystal display cells, also not shown.

The output circuits 16 are thus numbered as #1 to #n+1. The driver 10 further includes a corresponding plurality (n) of output selectors 20, thus numbered as #1 to #n, and a corresponding plurality (n) of output terminals 12, thus numbered as #1 to #n. Furthermore, the driver 10 includes a single decision circuit 30. Those components are interconnected as illustrated. The decision circuit 30 includes a comparator 34 and a decision output circuit 42, which are interconnected as depicted.

Each of the output circuits 16 has its one signal line 14 connected to corresponding one of the output selectors 20 to deliver an output signal over the signal line 14 to the output selector 20. Each of the output circuit 16 also has its other signal line 18 connected in common to the decision circuit 30 to deliver an output signal to the decision circuit 30 over the signal line 18. As seen from the figure, ones #2-#n of the output circuits 16 have the signal line thereof 14 connected in common to two neighboring ones of the output selectors 20.

The output selectors 20 are connected to the respective output terminals 12. Each of the output selectors 20 is adapted to select either one of the two output signals received over the signal lines 14 from the two neighboring output circuits 16 to output a signal thus selected on its output port 21. For example, the k-th output selector (#k) 20 selects the output 14 from either the k-th output circuit (#k) 16 or the (k+1)-th output circuit (#k+1) 16 to deliver the selected output signal 21 to the k-th output terminal (#k), where k is a natural number not exceeding n. Signals are designated with the reference numerals of connections on which they are conveyed.

The decision circuit 30 includes the comparator 34 and the decision output circuit 42. The signal lines 18 and 32 are connected to corresponding input ports of the comparator 34, which is adapted to compare both inputs 18 and 32 with each other to produce an output 36 resultant from the comparison. The decision output circuit 42 has its input port connected to the signal line 36 and its output port 40 interconnected in common to the output circuits 16.

Figure 2:
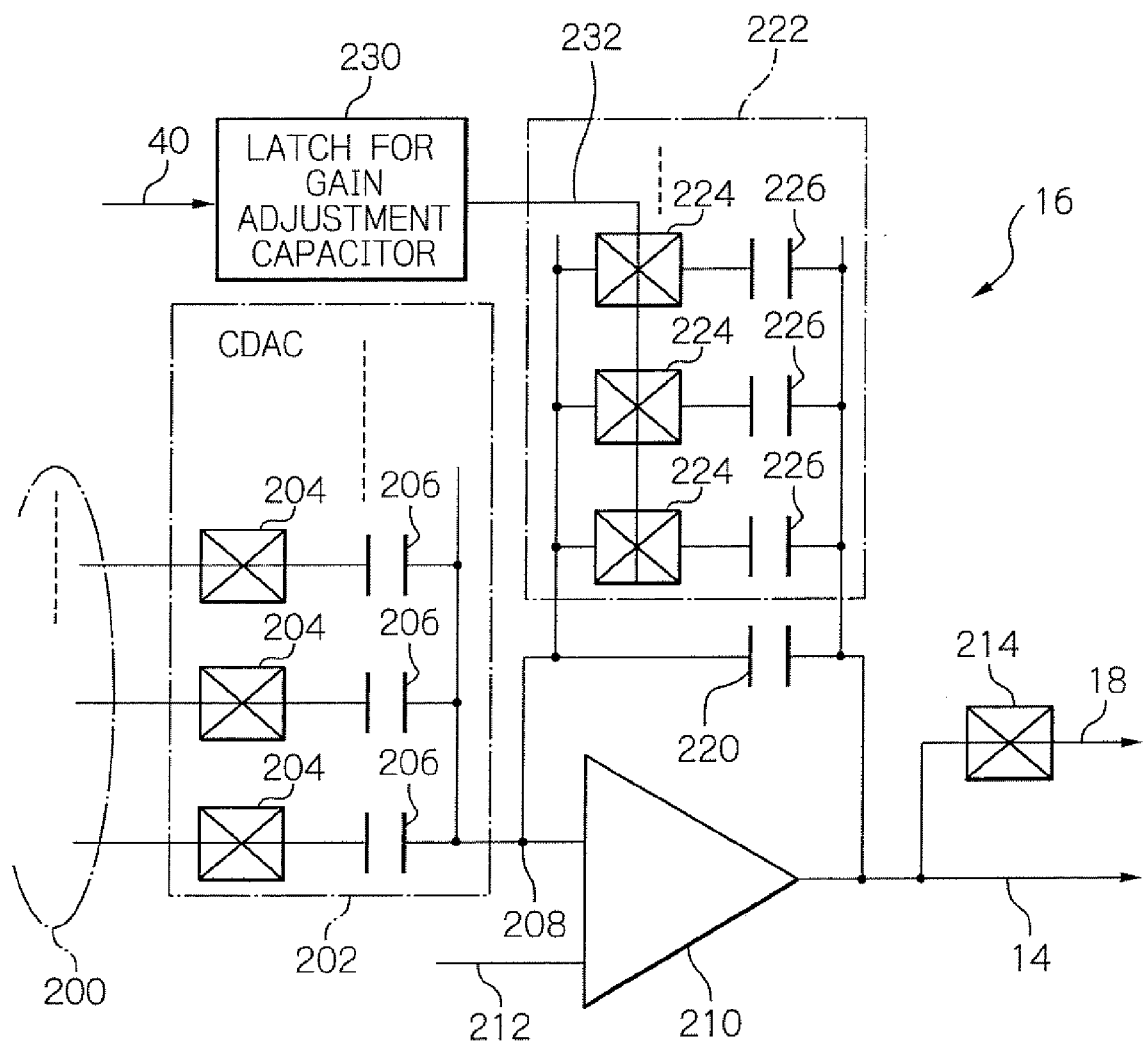
FIG. 2 is a schematic block diagram showing a basic illustrative constitution of an output circuit in the embodiment shown in FIG. 1.

The comparator 34 is adapted to compare the input signal, or voltage, delivered by the output circuits 16 over the signal line 18 with a reference signal, or voltage, supplied over the signal line 32 to develop a resultant signal, or voltage, representing the result of comparison over the signal line 36 to the decision output circuit 42. The decision output circuit 42 is adapted to be responsive to the output voltage on the signal line 36 provided from the comparator 34 for deciding the value of amplification factor of the operational amplifier 210, FIG. 2, provided in each of the output circuits 16 to produce a decision output signal 40 representing the result of decision. The decision output circuit 42 functions as transferring the decision output signal 40 at a predetermined timing to the output circuits 16 over the signal line 40.

A feedback circuit is thus formed in which the decision output signal 40, representing the result of decision, is fed back to each of the output circuits 16, which are again responsive to the decision output signal 40 to produce the output signal over the other signal line 18.

The output circuits 16 are provided more than the output selectors by one, but may be provided more by two or more. In case the output circuits 16 are provided more than the output selectors 20 by two or more, the output selectors 20 may be adapted to select the output circuits 16 in a manner different from that described above. To the output terminals 12, connected are the LCD devices, or cells, of a liquid crystal display panel, for example. In FIG. 1, the input terminals of the output circuits 16 are not shown merely for simplicity, but in FIGS. 2 and 3 as connections 200.

Now, FIG. 2 shows an instance of a basic constitution of the output circuit 16 in the driver 10. The output circuit 16 includes an operational amplifier 210, a capacitive element 220, a switch 214, a set of input terminals 200, a capacitance type of digital-to-analog converter (CDAC) 202, a capacitor circuit 222 and a latch for gain adjustment capacitor 230.

The output circuits 16 may all be of the same constitution. The latch for gain adjustment capacitor 230 functions as memory means, while the capacitive element 220 functions as a feedback element forming part of a feedback loop of the operational amplifier 210.

The digital-to-analog (D/A) converter 202 includes serial connections of a switch 204 and a capacitive element 206 which has its one plate interconnected in common to the one input 208 of the operational amplifier 210 as depicted in FIG. 2. The capacitor circuit 222 includes serial connections of a switch 224 and a capacitive element 226, which are interconnected in parallel to each other as illustrated.

More specifically, when the switches 204 are selectively closed, i.e. rendered conductive, corresponding ones of the capacitive elements 206 are selectively connected to the terminals 200. Similarly, when the switches 224 are selectively closed, or rendered conductive, corresponding ones of the capacitive elements 226 are selectively connected in parallel to the capacitance 220, i.e. joined in the feed back path of the operational amplifier 210. The capacitive elements 226 are thus associated with the switches 224 in a one-to-one relationship. In the prior art, such capacitive elements were individually controlled to switch so that a latch circuit required was bulky and complicated in control. However, the illustrative embodiment provides for simplified switching control of the switches 224, which will be described below.

Figure 3:
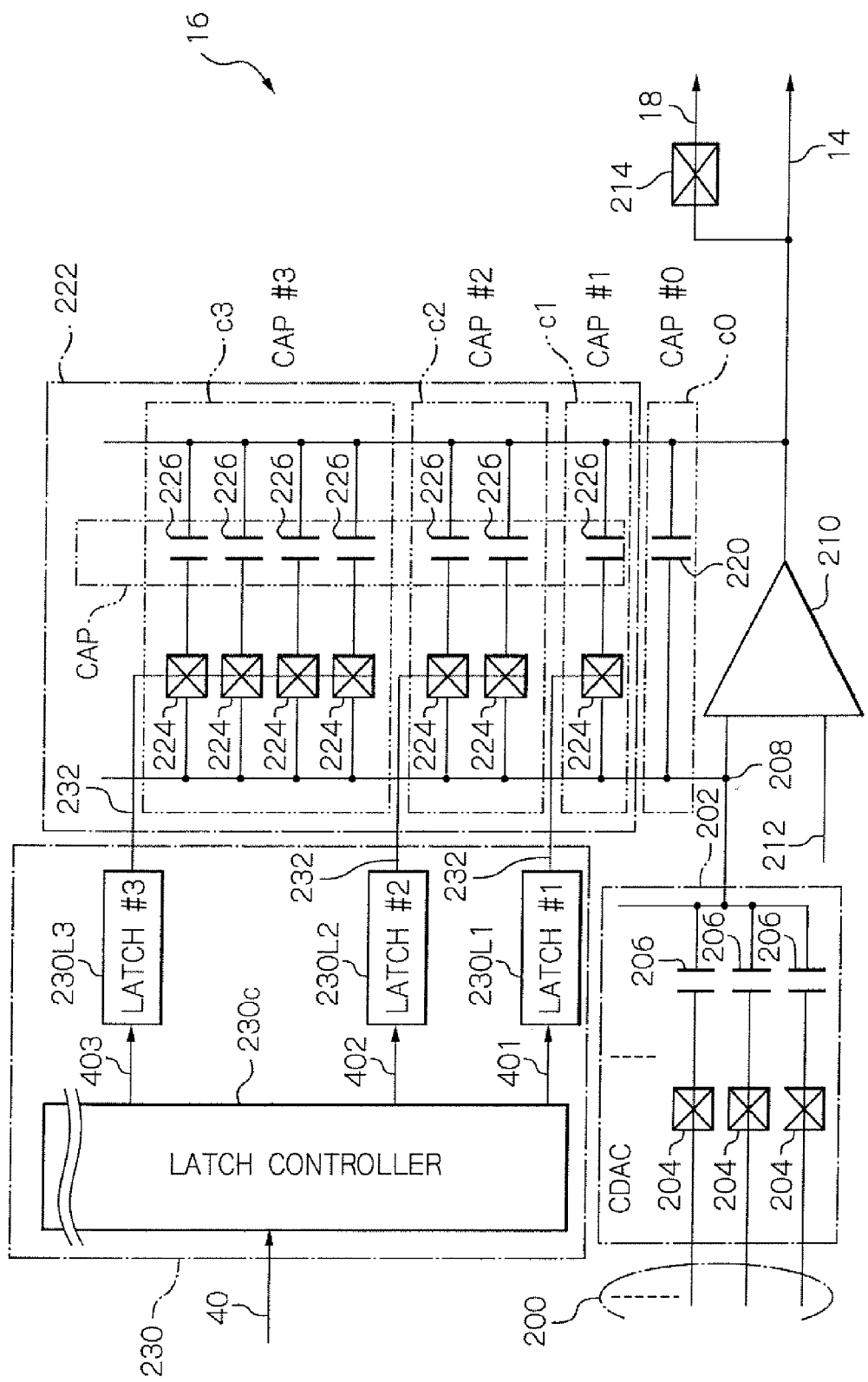
FIG. 3 is a detailed block diagram showing an output circuit in the embodiment shown in FIG. 1.

FIG. 3 shows a detailed example of the constitution of the output circuit 16 according to the illustrative embodiment. In the figure, like components are designated with the same reference numerals. In the capacitor circuit 222 shown in FIG. 3, the capacitive elements 226 and the switches 224, for example, are the same in constitution as FIG. 2. There is in FIG. 3, however, a point of difference as to the latch circuits included in the latch for gain adjustment capacitor 230 and connections to the switches 224.

In addition, the capacitive elements 226 and the switches 224 are grouped into capacitance (CAP) groups in a fashion described below. Specifically, the capacitance element 220 forms a CAP group #0, c0. In the order of the closest to furthest positions from the CAP group #0, c0, a CAP group #1 is arranged to be connected in parallel with the CAP group #0, c0. In each of these CAP groups, there is formed one or more sets of feedback elements. From the CAP group #1 on, increasing numbers of 2, 4, 8 and so forth, i.e. to the m-th power of two, where m is a natural number, of the capacitive elements 226 and the switches 224 are provided to constitute CAP groups #2, c2, #3, c3, #4, c4 and so forth. These CAP groups are commonly connected in parallel with the CAP group #0, c0. The capacitive elements 226 are collectively referred to as the capacitance for gain adjustment (CAP).

In the illustrative embodiment, the latch for gain adjustment capacitor 230 includes latches #1, 230L1, #2, 230L2, #3, 230L3 and so forth in association with the plural CAP sets. These latches 230 are connected to a latch controller 230c.

The set of input terminals 200, D/A converter 202, operational amplifier 210 and switches 214 of the output circuit 16 of the illustrative embodiment are similar in constitution, connection and operation to the corresponding parts of the output circuit 16 shown in FIG. 2.

The input terminals 200 are provided for receiving corresponding input bits of an input digital signal for driving the LCD display cells of an LCD device, not shown, to be connected to the corresponding terminals 12, the input digital signal thus carrying information to be displayed on the LCD device. In other words, the input terminals 200 are provided on a bit-by-bit basis of the input digital signal. For example, when such a digital signal is formed by eight bits, there are provided eight input terminals 200.

The D/A converter 202 is connected to convert the input bit signals received on the input terminals 200 to corresponding analog signals, which are in turn summed together to form a combined analog signal, which will then be transferred on the signal line 208. The combined analog signal is transferred on the signal line 208 in the form of input voltage to one input of the operational amplifier 210. The operational amplifier 210 has its other input port 212 connected to receive a reference signal in the form of voltage. The operational amplifier 210 is adapted to be responsive to a potential difference between the two signals, received on its inputs 208 and 212 to amplify the difference to form a corresponding output signal, or voltage, which will in turn be developed on the signal line 14 via a switch 214 to the signal line 18. The capacitive element 220 serves as a feedback capacitance to the operational amplifier 210.

The switch 214 serves to deliver the output voltage, developed from the operational amplifier 210 over the signal line 14, to the connection 18. The output voltage is transferred over the signal line 18 while the switch 214 is turned on, i.e. conductive. If the switch 214 is off, i.e. non-conductive, then the output voltage is transferred only over the signal line 14.

The switches 224 provided in the CAP groups #1, #2 and #3, i.e. c1, c2 and c3, and so forth are controlled to be turned on or off in response to switching signals supplied from the latch for gain adjustment capacitor 230, which is configured for adjusting the static capacitance of the capacitor circuit 222. It is observed that the switches 224 shown in FIG. 2 are interconnected to receive the switching signals delivered from the latch for gain adjustment capacitor 230 over the signal lines 232, and that those switching signals control the on and off states of the switches 224.

The capacitor circuit 222 shown in FIG. 3 is constituted by the plurality of capacitive elements 226 configured for adjusting the gain responsive to the decision output signal 40 delivered by the decision circuit 30.

The D/A converter 202 has switches 204 interconnected in series with one plate of the respective capacitive elements 206. The serial connections of the switch 204 and the capacitive element 206 are provided correspondingly to the input bits of the digital signal received on the input terminals 200. The serial connections of the switch 204 and the capacitive element 206 are connected in parallel with one another. The D/A converter 202 has its output port, formed by the other plates of the capacitances 206 interconnected in common, coupled to the signal line 208.

The operational amplifier 210 has its one input connected to the signal line 208 and its other input connected to the signal line 212, as well as its single output connected to the signal line 14.

The capacitive element 220 has its one plate connected to the signal line 14 and also to the output of the operational amplifier 210. The capacitive element 220 has the other plate connected to the signal line 208 that is connected to the output of the D/A converter 202 and the one input of the operational amplifier 210.

As described above, the capacitor circuit 222, configured for adjusting the gain of the operational amplifier 210, is made up of the plurality of serial connections of the switch 224 and the capacitive element 226. These switches 224 and capacitive elements 226 are connected in parallel with the capacitive element 220.

The latch controller 230c has its input port connected by the signal line 40 to the decision output circuit 42 of the decision circuit 30, FIG. 1.

The latch controller 230c has its output signal line 401 connected to the latch #1, 230L1, to provide a control signal 232 to the input of the CAP group #1, c1, which includes a single, serial connection of switch 224 and capacitance 226. In a similar manner, control signals from the latch controller 230c are coupled by the signal lines 402, 403 and so forth to the input ports of the latches #2, 230L2, #3, 230L3 and so forth. These latches have the output port 232 coupled by the signal lines to CAP groups #2, c2, #3, c3 and so forth at the respective switches 224. The CAP groups #2, c2, #3, c3 and so forth include two, four, eight switches 224 and so on, as illustrated.

It is to be noted that the latch for gain adjustment capacitor 230 shown in FIG. 2 includes latches for outputting signals for controlling the switches 224 to be turned on and off associated in number with the switches 224 of the capacitor circuit 222. These latches, enclosed in the so-called latch for gain adjustment capacitor 230, are in one-to-one correspondence with the switches 224, and each of the latches is connected by the signal line 232 to corresponding one of the switches 224.

The operation of the output circuit 16 according to the illustrative embodiment will now be described. For an illustrative purpose only, the embodiment will be described in operation when the capacitor circuit 222 include seven capacitive elements 226 in total of the gain adjustment capacitor CAP groups, that is, the CAP group #1, c1, includes one, the CAP group #2, c2 includes two and the CAP group #3, c3 includes four, as depicted.

Initially, off signals are written in all of the latches for gain adjustment, that is, the latches #1, 230L1, #2, 230L2 and #3, 230L3, so that all of the switches 224 are turned off. In this state, the switch 214 in the output circuit #1, 16, is turned on, while the switches in the remaining output circuits #2, to #n+1, 16, are all turned off.

Under the circumstance, the switches 214 are controllable by the latch controller 230c enclosed in the latch for gain adjustment capacitor 230. The latch controller 230c is controlled in such a manner that on/off signals are retained by the latches #1, 230L1, #2, 230L2 and #3, 230L3, based on the decision output signal delivered over the signal line 40, to control the combinations of on/off, i.e. conductive or non-conductive state of the switches 224.

The first one #1 of the output selectors 20, FIG. 1, switches its connection so as to transfer the output signal 14 of the second one #2 of the output circuits 16 to the first one #1 of the output terminals 12. In a similar manner, the output selectors 20 sequentially switch the respective connections so as to transfer the output signal of the thus corresponding output circuits 16 to the output terminals 12, until the n-th one #n of the output selectors 20 switches its connection so as to transfer the output signal of the last one #n+1 of the output circuits 16 to the final one #n of the output terminals 12.

The offset canceling operation for the output circuit #1, 16, will then be carried out. Initially, the switches 224 in the capacitor circuit 222 are all turned off by the latch for gain adjustment capacitor 230. In this state, the operational amplifier 210, having its gain set by the capacitive element 220 serving as a feedback element, develops an output signal over the signal line 14. The signal 14 is also delivered via the switch 214 over the signal line 18 to the decision circuit 30. The output signal supplied to the decision circuit 30 is supplied to the comparator 34. The comparator 34 compares the voltage of the output signal transferred over the other signal line 18 with the reference voltage of the signal supplied on the signal line 32, and produces an output signal resulting from the comparison and corresponding to the difference on the signal line 36 to the decision output circuit 42. Based on the signal 42, the decision output circuit 42 produces a decision output signal resultant from the decision at a predetermined timing on the signal line 40.

The decision output signal, output from the decision circuit 30, is delivered over the signal line 40 to the respective output circuits 16. The first one #1 of the output circuits 16, when supplied with the decision output signal 40, causes the decision output signal 40 to be retained or stored in the latch for gain adjustment capacitor 230.

In this state, the decision circuit 40 monitors the output signal 18. If the decision output circuit 42 has determined that the gain of the output circuit 16 of the driver 10 is higher than an ideal, or predetermined, value, then the decision output circuit 42 produces and transfers a decision output signal indicating that the gain is higher than the ideal, i.e. target, value over the signal line 40 to the latch controller 230c. Upon receipt of the decision output signal 40, the latch controller 230c writes an 'on' signal in the latch #3, 230L3, via the signal line 403, to cause the CAP group #3, c3, including the parallel connection of four capacitive elements 226, to be turned on. With the CAP group #3, c3, thus turned on, the combined capacitance of the four gain adjustment capacitors CAP is increased, thus reducing the gain of the operational amplifier circuitry. The decision will further continue in this state.

The decision circuit 30 in this state causes the decision output signal, delivered from the decision circuit 300 over the signal line 40, to be again stored in the latch for gain adjustment capacitor 230.

If the gain is still higher than the ideal value, the value for the latch #3, 230L3, is turned 'on' and the 'on' state is written in the latch #2, 230L2, with the CAP group #3, c3, maintained on, thereby causing the CAP group #2, c2, to be turned on. Thereupon, the combined capacitance of the gain adjustment capacitors CAP will further be increased, thus rendering the gain further reduced.

If conversely the gain is smaller than the ideal value, then an 'off' state is written in the latch #3, 230L3, to thereby turn off the CAP group #3, c3, while an 'on' state is written in the latch #2, 230L2, to thereby turn on the CAP group #2, c2. That renders the combined capacitance of the gain adjustment capacitors CAP decrease so as to increase the gain of the operational amplifier circuitry.

Similarly, decision is made for each of the latches #2, 230L2, and #1, 230L1, so as to determine the signals of all of the latches. By repeating the above sequence of operation, the latch for gain adjustment capacitor 230 controls the on/off state of the latches #2, 230L2, and #1, 230L1, to change over the on/off state of the switches 224 of the CAP groups #2, c2, and #1, c1, of the capacitor circuit 222 to thereby adjust the gain.

Each time the above sequence of operation has come to its end, the decision circuit 30 compares the voltage of the output signal fed on the other signal line 18 with the reference voltage of the signal supplied on the signal line 32 to deliver the result of comparison as a decision output signal over the signal line 40 to the output circuit 16, thus conducting the feedback operation. This feedback operation will be carried out repeatedly.

In the decision circuit 30, if the voltage in the output signal supplied on the other signal line 18 has become lower than the reference voltage in the signal fed on the signal line 32, the offset canceling operation comes to close.

When the offset canceling operation of the first one #1 of the output circuits 16 has come to close, the switch 214 of the first one #1 of the output circuits 16 is turned off, and the switch 214 of the second one #2 of the output circuits 16 is turned on. The first one #1 of the output selectors 20 simultaneously connects the output signal of the first one #1 of the output circuits 16 to the first one #1 of the output terminals 12. With this connection state, the offset canceling operation is carried out for the second one #2 of the output circuits 16 in the same way as described above.

The offset canceling operation is carried out in this manner in the output circuit 16 of each of the output circuits #1 to #n+1, 16. When the offset canceling operation up to the final output circuit #n+1, 16, has come to end, the offset canceling operation for the output circuits #1 up to #n+1, 16 will be repeated.

It is observed that the on and off control of the totality of latches, the offset canceling operation and the operation of sequentially switching the output circuits 16 to cancel the offset are controlled by the latch controller 230c of the latch for gain adjustment capacitor 230.

In case there are several output circuits 16 on which the offset canceling operation as described above has not yet been carried out at the timing, the D/A converters 202 of such output circuits 16, for which the offset canceling operation is not going on, convert the predetermined number of bits of the digital input signal, received on the set of the input terminals 200, to a corresponding analog signal 208. This analog signal 208 is then supplied to the one input of the operational amplifier 210 over the signal line 208. In parallel therewith, the input analog signal 208 is amplified against the reference voltage supplied to the other input of the operational amplifier 210 on the signal line 212 in accordance with the capacitance established on the capacitive element 220 and the capacitor circuit 222.

Thus, even when the feedback element, such as capacitive or resistance element, is disposed outside the operational amplifier circuitry per se, offset may be canceled with ease. Moreover, the offset canceling operation may be carried out simultaneously with the usual operational amplification, i.e. driving the LCD device, for example.

In addition, the offset canceling operation is carried out by determining the gain adjustment value on the basis of the number of connected ones of the gain adjustment capacitors CAP increased or decreased or set in each of the CAP groups, whereby the error in gain may be reduced to less than that corresponding to one feedback capacitance element which is a sort of feedback element. Specifically, the gain error may be reduced to less than that of one gain adjustment capacitor CAP.

For example, the illustrative embodiment includes the seven gain adjustment capacitors CAP, and therefore the three latches are sufficient to repeat four times the decision on the output signal 18. Hence, gain adjustment may be made in a short time with the reduced number of times of repetition, thus attaining a short time offset canceling. If the fifteen capacitances are provided, then the four latches are sufficient to repeat the decision five times. Thus advantageously, the more capacitors the more efficient offset canceling in time.

Further, if it is desired to raise the accuracy in offset scanning, it is necessary to reduce the gain adjustment capacitance CAP of the capacitive elements 226 for purpose of reducing the quantization step, as well as to increase the number of capacitances. With the illustrative embodiment, the more gain adjustment capacitors CAP, the fewer latches for gain adjustment suffice, thus the circuitry being reduced in size.

FIGS. 2 and 3 show the illustrative embodiments of the operational amplifier capable of canceling offset. The arrangement for canceling offset implemented in the output circuits 16 may also be applied to, for example, the comparator 34 shown in FIG. 1. The output circuits 16 of the illustrative embodiments shown in FIGS. 2 and 3 are designed to progressively decrease and increase the output voltage during the offset canceling operation. This is, however, not to be restrictive but a solution may be used of finding out an optimum value of the capacitance value by binary searching. It is also possible to arrange smaller steps between the capacitive elements 226 used for gain adjustment to achieve a higher offset accuracy to provide smoother output voltages over the entire output terminals 12.

Figure 4:
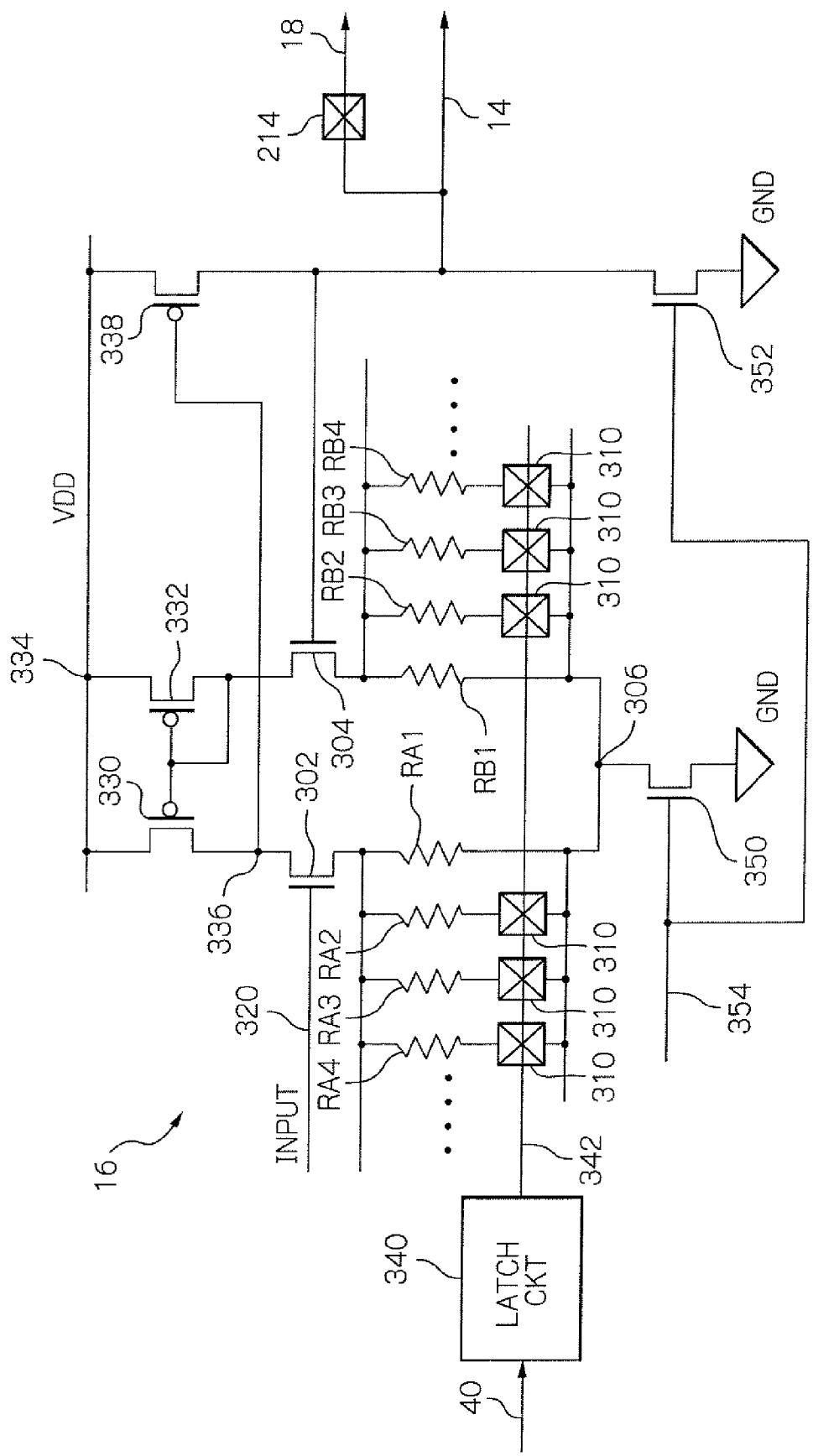
FIG. 4 is a schematic block diagram showing an alternative embodiment of the output circuit in the liquid crystal display driver.

FIG. 4 shows a modification from the output circuit 16 shown in FIG. 2. The output circuit 16 includes a differential transistor circuit comprised of a pair of N-type field effect, or NMOS, transistors 302 and 304 interconnected as illustrated.

The output circuit 16 shown in FIG. 4 includes resistance elements RA1, RA2, RA3, RA4 and so forth, as well as RB1, RB2, RB3, RB4 and so forth. The output circuit 16 further includes a corresponding plurality of switches 310, a switch 214 and a latch 340, which are interconnected as depicted. Those resistance elements all act as feedback elements, and the latch 340 may be of the same constitution as the latch for gain adjustment capacitor 230.

The output circuit 16 also includes a current mirror circuit constituted of a pair of P-type field effect, or PMOS, transistors 330 and 332 which are interconnected as depicted. Further, the output circuit 16 includes a P-type field effect transistor 338, and N-type field effect transistor 350 and 352 which are interconnected as shown.

Specifically, the resistance elements RA2, RA3 and so forth as well as RB2, RB3 and so forth are selectively connected according to the on/off state of the respective switches 310. However, since the switches 310 are associated with the resistance elements RA2, RA3 and so forth as well as RB2, RB3 and so forth in a one-to-one relationship so as to be controlled in switching individually. The output circuit 16 thus modified gives rise to increasing the number of the latches so as to render the control complicated. Hence, in a further alternative embodiment, the switching control of these switches 310 is simplified, which will be described.

Figure 5A:
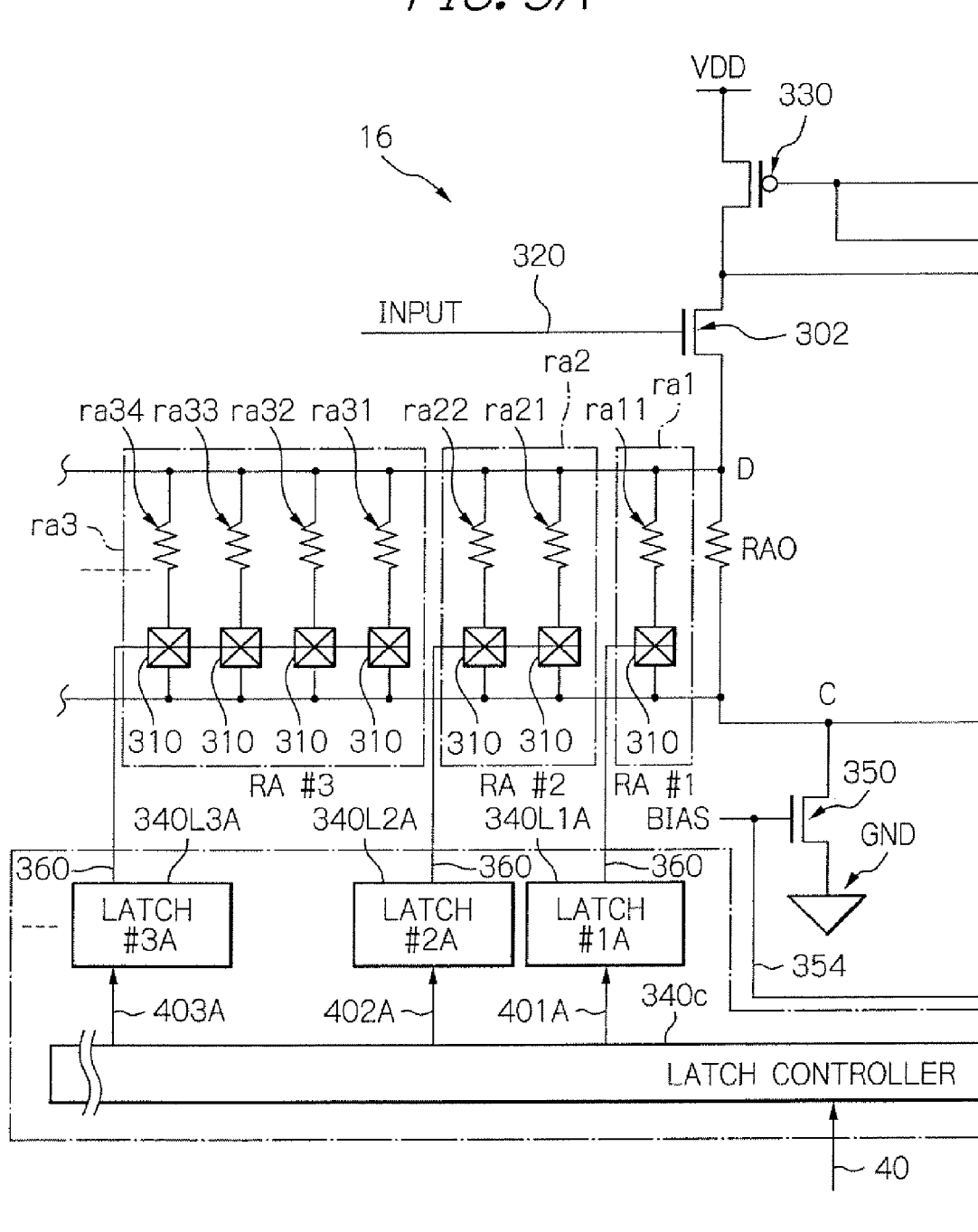
FIGS. 5A and 5B are a block diagram, when combined as shown in FIG. 6, showing a detailed example of the output circuit of a further alternative embodiment of the present invention.
Figure 5B:
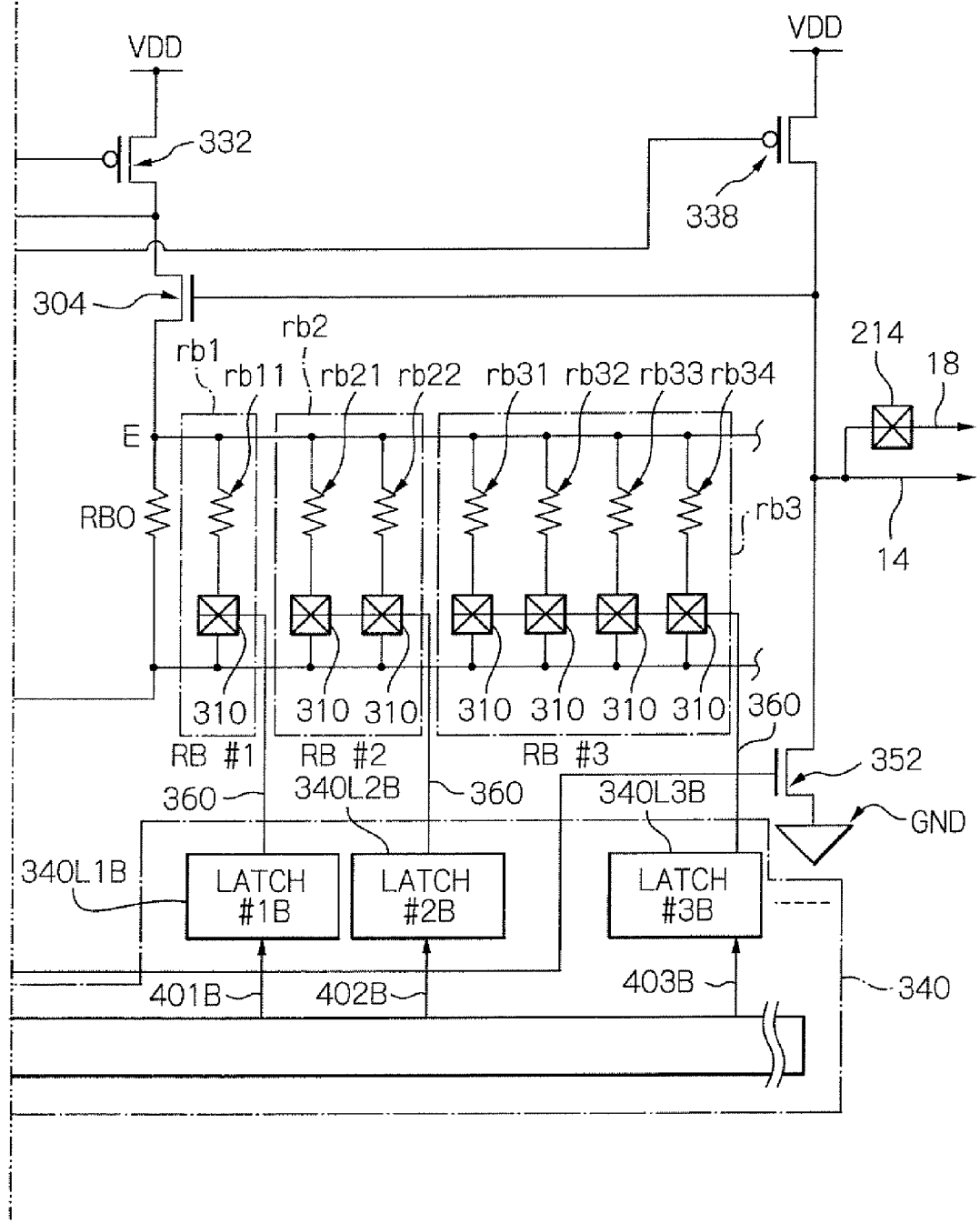

FIGS. 5A and 5B, when combined as shown in FIG. 8, show in detail an exemplified constitution of the output circuit 16 of such an alternative embodiment. As shown in the figures, the output circuit 16 of the instant alternative embodiment includes PMOS transistors 330 and 332 forming a current mirror circuit, as well as NMOS transistors 302 and 304 forming a differential transistor circuit. The output circuit 16 shown in FIGS. 6 and 7 is analogous in constitution, connection and operation with the output circuit 16 shown in FIG. 4 showing the modification of the circuit 16 shown in FIG. 2.

The output circuit 16 shown in FIGS. 6 and 7 further includes the PMOS transistor 338, NMOS transistors 350 and 352, latch 340 and switch 214, and is analogous in constitution, connection and operation with the output circuit 16 shown in FIG. 4.

The output circuit 16 of the present alternative embodiment also includes RA#1, ra1, RA#2, ra2, RA#3, ra3, and so forth, FIG. 5B, each being a serial connection of resistance element ra– and switch 310, as depicted. These are sometimes collectively referred to as system RA. The output circuit 16 further includes RB#1, rb1, RS#2, rb2, RB#3, rb3, and so forth, FIG. 6, each being a serial connection of resistance element rb– and switch 310. These are also sometimes collectively referred to as system RB. In the system RA, the first group RA#1, ra1, is made up of a serial connection of resistance element ra11 and switch 310. The second group RA#2, ra2, is made up of two serial connections of resistance element ra21 or ra22 and switch 310. The third group RA#3, ra3, is made up of four serial connections of resistance element ra31, ra32, ra33 or ra34 and switch 310. The system RB is configured in a similar manner.

The PMOS transistors 330 and 332 have the source electrode thereof supplied with a power supply voltage VDD as a source voltage. Meanwhile, the source voltage VDD is also supplied to a signal line 334 shown in FIG. 4.

The NMOS transistor 350, connected to a junction, or node, C, corresponding to the node 306 shown in FIG. 4, and the NMOS transistor 352, connected to the drain electrode of the PMOS transistor 338, have respective gates electrodes supplied with a bias voltage (BIAS) on a signal line 354 to constitute the current source.

The latch 340 is a memory circuit that is for use in controlling the respective switches 310 of the systems RA and RB. It is noted that, in the output circuit 16 shown in FIG. 4 also, the latch 340 is adapted to transfer an on/off signal from its output port over the signal line 342 to the switch 310.

The latch 340 is also adapted to hold the decision output signal, supplied thereto over the signal line 40 and cause, by the decision output signal thus held, a desired switch or switches 310 to be turned on or off by the latches #1A, 340L1A, #2A, 340L2A, and so forth, collectively termed a latch system A, and by the latches #1B, 340L1B, #2B, 340L2B, and so forth, collectively termed a latch system B. It is noted that the latch 340 shown in FIG. 4 may be configured similarly to the latch for gain adjustment capacitor 230 shown in FIG. 2 to hold the decision output signal supplied over the signal line 40. The decision output signal thus held by the latch causes a desired switch or switches 310 to be turned on or off by latches, not shown, provided within the latch for gain adjustment capacitor 230.

In the output circuit 16, the latch 340 receives the decision output signal 40 which is representative of the result of decision of the amplification factor of the operational amplifier of the output circuit 16 and output from the decision circuit 30, FIG. 1.

The output of the operational amplifier, provided in the output circuit 16, is supplied over the signal line 14 to the gate electrode of the NMOS transistor 304, and hence the output circuit 16 operates as a voltage follower. The switches 310 are on/off controlled by the value retained by the latch 340.

With the instant alternative embodiment, the output circuit 16 includes a latch controller 340c that is connected to the decision output circuit 42 of the decision circuit 30, FIG. 1, by the signal line 40. The embodiment shown in FIG. 4 also includes a latch controller, although not shown, corresponding to the latch controller 340c which is connected to the latch systems A and B.

In the modification shown in FIG. 4, the resistance element RA1 is connected between the NMOS transistor 302 and the node 306, whereas, in the instant alternative embodiment, shown in FIGS. 5A and 5B, the resistance RA#0 is connected between the nodes D and C. Also, the resistance element RB#1 shown in FIG. 4 is connected between the NMOS transistor 304 and the node 306, whereas, in the instant alternative embodiment, shown in FIGS. 5A and 5B, the resistance element RB#0 is connected between the nodes E and C.

The control signal is coupled from the latch controller 340c to the input port of the latch #1A, 340L1A, by a signal line 401A, whilst the output port of the latch #1A, 340L1A, is connected by a signal line 360 to the sole switch 310 of RA#1, ra1. In a similar manner, the control signal from the latch controller 340c is coupled by the signal lines 401A, 402A, 403A and so forth to the input port of the latches 340L1A, 340L2A, 340L3A and so forth, respectively. The control signal from the latch controller 340c is coupled by the signal lines 401B, 402B, 403B and so forth to the input port of the latches 340L1B, 340L2B, 340L3B and so forth, respectively. The output ports of the latches 340L1A, 340L2A, 340L3A and so forth and 340L1B, 340L2B, 340L3B and so forth are connected by the signal lines 360 to the plurality of switches 310 of systems RA and RB, respectively. Each of the systems RA and RB includes the two, four, eight switches and so forth as shown in FIGS. 6 and 7.

The latch system A is latch circuitry, whereas the system RA is plural serial connections of resistance element and switch. The resistance elements function as a sort of feedback element.

The foregoing description has been centered mainly on the system RA. It is noted however that the system RB is configured similarly to and is arrayed in an opposing relationship to the system RA.

FIG. 4 is drafted in such a fashion that the signal line 342 extends from the latch 340 as if it were a sole signal line connected to all of the switches 310. However, in practice, each latch is connected to one of the switches 310 so that there are provided the plurality of signal lines 342 and the corresponding plurality of latches to the number of the switches 310.

The system RA, composed of the plurality of resistance elements re– and the plurality of switches 310, are provided in parallel with the resistance element RA0. In a similar manner, the system RB, composed of the plurality of resistance elements and the plurality of switches 310, are provided in parallel with the resistance element RB0. To the switches 310 of the system RA, connected are signal lines for transferring outputs of the latch system A. In a similar manner, to the switches 310 of the system RB, connected are signal lines for transferring outputs of the latch system B.

The operation of the output circuit 16 of the instant alternative embodiment will now be described. For a description sake, the embodiment includes seven resistance elements provided in parallel with each of resistance elements RA0 and RB0. Initially, with all of the latches turned off, the output signal (voltage) is compared with the ideal value (predetermined gain). A decision output signal is delivered from the decision output circuit 42 to the latch controller 340c over the signal line 40. If the decision output signal is lower than the ideal value, that is, if the gain is low, an 'on' signal is written in the latch #3A, 340L3A, to thereby render the resistance RA#3, ra3, connected, thus lowering the resistance value between the nodes D and C.

This increases the gate-to-source voltage Vgs of the NMOS transistor 302, the one transistor of the differential transistor circuit, so that more current is allowed to flow therethrough. As a result, the output is increased slightly. The output signal at this time is compared with the ideal value to give a decision. A new decision output signal is delivered from the decision output circuit 42 to the latch controller 340c over the signal line 40. If the output is still low, an 'on' signal is written in the latch #2A, 340L2A, to thereby turn the RA#2, ra2, on. If the output is high, the latch #3A, 340L3A, is turned off, while the latch #2A, 340L2A, is turned on. Similar operation will be carried out on the latch #1A, 340L1A, to finish the offset canceling. At the initial decision, if the output is high, an 'on' signal is written in the latch #3B, 340L3B, and subsequently the 'on' signal is written in the latch #2B, 340L2B, followed by the latch #1B, 340L1B.

It is noted that this output circuit 16 may be replaced by an operational amplifier. In that case, the one input terminal of the operational amplifier corresponds to a signal line INPUT, 320, while the other input fed with the reference voltage input and the output of the operational amplifier correspond to a gate electrode of the NMOS transistor 304 and the signal line 14 or 18, respectively.

When the offset canceling operation in the output circuit #1, 16, has come to close, the switch 214 in this output circuit is changed over to its 'off' state. The switch 214 in the next output circuit #2, 16, is then changed over to its 'on' state. When the offset canceling operation has come to close, at the time of switching, the switch 214 in the output circuit #1, 16, is changed over to its 'off' state by the latch controller 340c. This latch controller 340c controls the on and off switching of the plurality of latches enclosed in the latch 340 of the output circuit #1, 16. The latch controller 340c also controls the operation of changing over the switch 214 provided in the next output circuit #2, 16, by the latch controller 340c configured for controlling the on and off switching of the latches enclosed in the output circuit #2, 16. The offset canceling operation is then continued in a similar sequence of operation.

The output selectors 20 are also switched simultaneously. An output signal of the output circuit #1, 16, is transferred to the output terminal #1, 12. The offset canceling operation is then carried out sequentially in the output circuits of the next and following stages, namely the output circuits #2 up to #n+1, 16. When the offset canceling operation of the output circuit #n+1, 16, has come to close, the operation reverts to the output circuit #1, 16, from which the offset canceling operation will be repeated.

It should be noted that the on/off control of the totality of latches, offset canceling operation and operation of sequentially switching the output circuits 16 in the course of offset canceling operation are controlled by the latch controller 340c of the latch for gain adjustment capacitor 340.

Hence, even if the feedback element, such as the capacitive or resistance element, is provided outside the amplifier per se, the offset can be canceled with ease, while the offset canceling operation may be carried out simultaneously with the usual operational amplification.

In the conventional system, the switches and latches were provided in one-to-one correspondence. In accordance with the present invention, however, the number of latches may be decreased appreciably, thereby reducing the circuit size. Additionally, the times of feedback operation may be significantly reduced to assure offset canceling within a short time.

For example, if seven resistance elements are connected in parallel, usually fourteen latches would need to be provided on each arm of the differential transistor pair, requiring fifteen times of feedback operation. With the illustrative embodiment shown in and described with reference to FIGS. 5A and 5B, the six latches may be sufficient with four times of feedback operation required. The use of fifteen resistance elements usually would require thirty latches with thirty-one times of feedback operation performed. With the above illustrative embodiment, eight latches may be sufficient with five times of feedback operation required.

The number of adjustment elements in gain adjustment and that in offset canceling operation may be determined by binary search, so that the latches and the times of feedback operation may be reduced further.

The instant alternative embodiment is directed to the illustrative constitution of the operational amplifier, capable of carrying out the offset canceling operation. That constitution in the output circuit may also be applied to, for example, the comparator 34 shown in FIG. 1. Also, in the instant alternative embodiment, the output voltage is progressively decreased or increased in the course of offset canceling operation. This is merely exemplary and such a solution may be applied which uses binary search, for example, to find out an optimum resistance value.

For example, the voltage follower type of output circuit, used in an LCD driver, may have offset canceled without using capacitive element. It is also possible to cancel the offset with higher precision by increasing the precision of the comparator and employing finer steps of the units of resistance element in the systems RA and RB.

The illustrative embodiments are adapted to selectively connect the capacitances having the same static capacitance to thereby attain weighting. This is merely exemplary and a plurality of capacitors having static capacitance different from each other may be provided while one or more of the capacitors may selectively be connected for weighting.

The entire disclosure of Japanese patent application No. 2007-96295 filed on Apr. 2, 2007, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and the spirit of the present invention.

What is claimed is:

1. Operational amplifier circuitry comprising:
a plurality of output circuits each including an amplifier having an output port connected through a feedback circuit forming a feedback loop to an input port of the amplifier, each of said plurality of output circuits receiving an input signal and producing an output signal adjusted with a gain of the feedback circuit;
a selector interconnected to said plurality of output circuits for selecting at least one of the output signals to output the selected output signal; and
a comparator for comparing a reference signal with the output signal not selected,
said feedback circuit comprising a plurality of feedback elements arranged to be selectable and weighted,
said selector being responsive to said comparator to selectively connect the feedback elements to the feedback loop, whereby offset of the amplifier is canceled.

2. The circuitry in accordance with claim 1, wherein said selector selects the output signals by binary search, and any of the amplifiers may be out of selection by said selector.

3. The circuitry in accordance with claim 1, wherein each of said plurality of feedback elements comprise a serial connection of a capacitor and a switch,
each of said output circuits comprising a latch circuit responsive to said comparator for causing said switches to be turned on or off.

4. The circuitry in accordance with claim 1, wherein said amplifier comprises a differential amplifier including a pair of transistors each connected with a serial connection of a resistance and a switch to form a voltage follower,
each of said output circuit comprising a latch circuit responsive to said comparator for causing said switches to be turned on or off.

5. Operational amplifier circuitry comprising:
a plurality of output circuits each including an amplifier having an output port connected through a feedback circuit forming a feedback loop to an input port of the amplifier, each of said plurality of output circuits receiving an input signal and producing an output signal adjusted with a gain of the feedback circuit;
a device driven by a combination of output signals fewer in number than the output signals produced by said plurality of output circuits;
a selector interconnected to said plurality of output circuits for selecting at least one of the output signals output from said output circuits required for driving said device to output the selected output signal;
a comparator for comparing a reference signal with the output signal not selected; and
an offset canceller operative in response to said comparator for adjusting the gain of said plurality of output circuits to thereby cancel offset of the amplifier,
said feedback circuit comprising a plurality of feedback elements, said feedback elements being connected to form a plurality of groups, each of which has at least one of the feedback elements provided different in number between the groups,
said offset canceller comprising:
a switching circuit for switching each of the plurality of groups so as to join the feedback loop; and
a control circuit for controlling said switching circuit to change a combination of the plurality of groups until said comparator determines a result of comparison acceptable.

6. The circuitry in accordance with claim 5, wherein said selector selects the output signals by binary search, and any of the amplifiers may be out of selection by said selector.

7. The circuitry in accordance with claim 5, wherein said switching circuit comprises a switch operative in response to said control circuit to be turned on or off,
each of said plurality of feedback elements comprising a capacitor connected in serial to said switch.

8. The circuitry in accordance with claim 5, wherein said amplifier comprises a differential amplifier including a pair of transistors each connected in serial to a resistance to form a voltage follower,
said switching circuit comprising a switch connected in serial to said resistance and operative in response to said control circuit to be turned on or off.

9. The circuitry in accordance with claim 5, wherein said feedback elements are the same as each other, each of the plurality of groups includes at least one of the feedback elements different in number between the groups, the number increasing up to an n-th power of two, where n is a natural number.

* * * * *